United States Patent [19]

Hester

[11] 4,323,854
[45] Apr. 6, 1982

[54] TEMPERATURE COMPENSATED CURRENT SOURCE

[75] Inventor: Richard E. Hester, Eden Prairie, Minn.

[73] Assignee: Control Data Corporation, Minneapolis, Minn.

[21] Appl. No.: 116,698

[22] Filed: Jan. 30, 1980

[51] Int. Cl.³ .......................... H03F 3/45; H03K 3/26
[52] U.S. Cl. ............................... 330/256; 307/296 R; 307/310; 330/288; 330/289; 330/296
[58] Field of Search .............. 330/256, 288, 289, 296; 307/296 R, 310

[56] References Cited

U.S. PATENT DOCUMENTS 3,831,040  8/1974  Nanda et al. ..................... 307/296
4,207,537  6/1980  Cave et al. ..................... 330/256 X
4,243,948  1/1981  Schade, Jr. ..................... 307/310 X

*Primary Examiner*—James B. Mullins
*Attorney, Agent, or Firm*—William J. McGinnis, Jr.; Joseph A. Genovese

[57] ABSTRACT

A temperature compensated current source includes three successive source current paths to produce a controlled output current. Each current path has a different value of current flowing therein so that current fluctuations in one current path will tend to be isolated from the other current paths because of the difference in current flow. In the embodiment of the invention shown, a reference zener diode provides a reference voltage at the base of a first transistor to establish a first reference current as its emitter current. A second transistor uses the first current as the reference to establish a second current value which has a positive temperature coefficient. Third, fourth and fifth transistors use the second reference current to establish a third reference current value independent of the gain values of these transistors. In the embodiment of the invention described, the third reference current is used to establish a reference voltage stable with respect to variations in the power supply, transistor gain and resistivity fluctuations of the circuit but with increasing voltage as a function of temperature. This voltage variation is used in combination with a load to cancel the effect of the load variations with temperature by providing an increased source voltage as a function of temperature.

11 Claims, 2 Drawing Figures

TEMPERATURE COMPENSATED CURRENT SOURCE

BACKGROUND OF THE INVENTION

This invention relates to a temperature compensated current source. This current source is shown in an embodiment in which the current varies as a function of the temperature of the system. This current variation as a function of temperature is used to compensate for a load which has changing characteristics as a function of temperature in such a way that the load fluctuations are offset so that the load appears to be temperature independent.

In particular, the present invention is shown as a temperature compensated current source used to provide a source current for a differential amplifier wherein the desired object is to have a constant amplifier gain in view of variations in ambient temperature. One application of this invention is as a head amplifier in a magnetic disk system for computers. Magnetic disk systems must be very stable but have a significant temperature fluctuation from cold-start to warm up.

A further aspect of the present invention is that it was desired to have a temperature compensated current source in which the output current from the current source would increase with temperature at a rate which could be adjusted by changing resistor values. In this way the temperature characteristics of a load, such as, for example, a multiple-stage differential amplifier, could be compensated such that the differential voltage gain of the amplifier would remain constant over a temperature range. The current source must also provide a constant current in view of fluctuations in power supply over a significant range. Also, a desirable characteristic of such a current source would be a high degree of independence from variations because of individual transistor gains. It is known, of course, that where the current source and the load, such as a differential amplifier, are to be temperature compensated, they should be exposed to exactly the same ambient temperature characteristics and this is most easily accomplished by having the entire circuit as part of a monolithic integrated circuit design.

SUMMARY OF THE INVENTION

The present invention employs a first transistor in combination with a zener diode to generate a first current which is used in combination with a second transistor device and a resistor to generate a second current which is smaller compared to the first current and has a positive temperature coefficient relative to the first current. The resistor controls the ratio between the first current and the second current. Third, fourth and fifth transistors are used in connection with the second current to provide a current source which is independent of the gain of the three transistors and which generates a third current equal to the second current. The third current is used to establish a reference voltage which is stable with respect to the power supply fluctuations, transistor gain and resistance variations but which increases with temperature. This varying voltage is then connected by an emitter-follower transistor circuit to create the output current for the current source of the present invention. The slope of the temperature characteristic of this output current can be adjusted by changing the value of two of the resistors.

IN THE FIGURES

DESCRIPTION OF THE PREFERRED EMBODIMENTS

Figure 1:
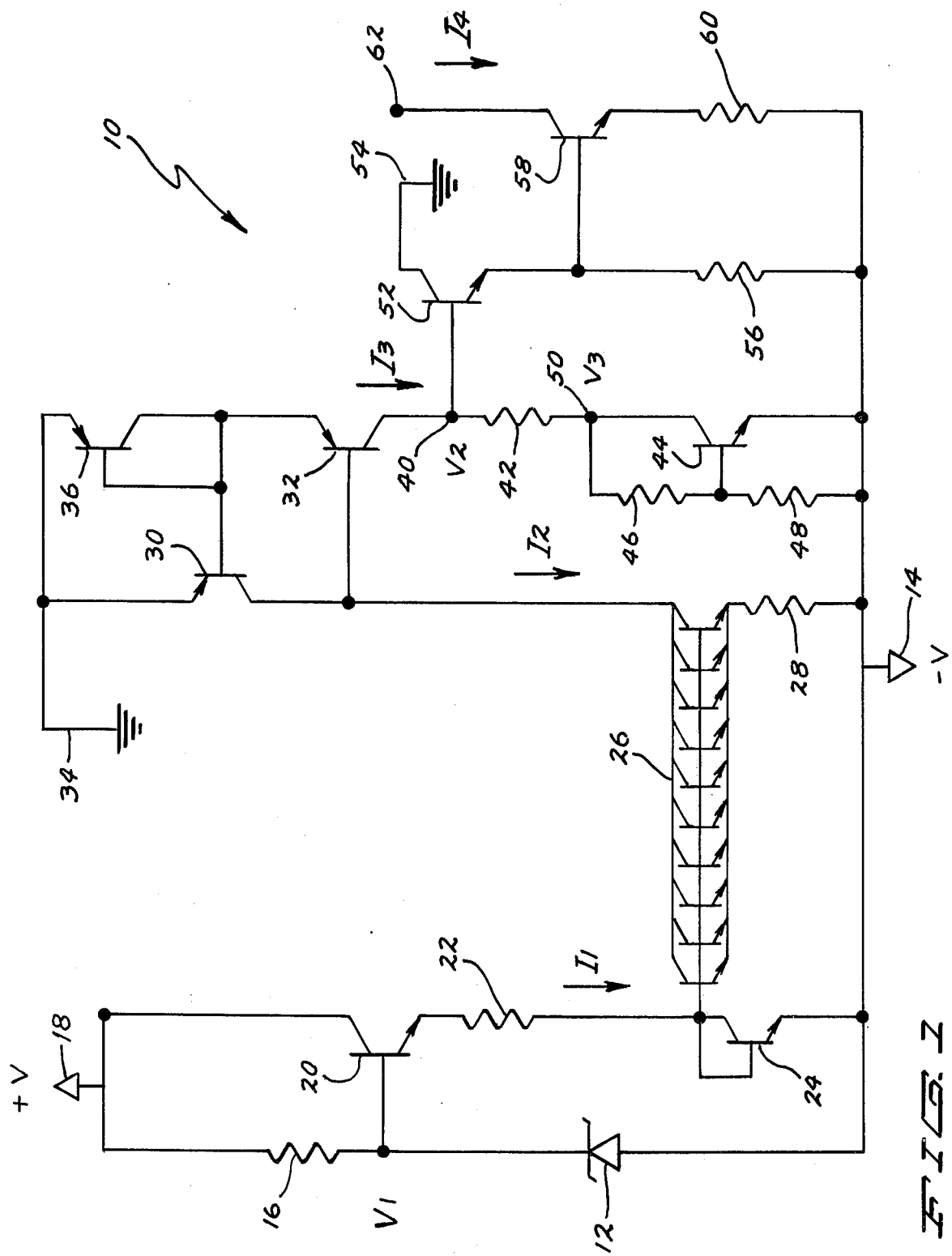
FIG. 1 is an electrical circuit diagram of a temperature compensated current source according to the present invention.

Referring now to FIG. 1, a temperature compensated current source 10 according to the present invention has a zener diode 12 connected to a source of negative voltage potential 14. The zener diode 12 is also connected through a resistor 16 to a source of positive direct current voltage 18. The base of a transistor 20 is connected to the junction between zener diode 12 and resistor 16. The collector of transistor 20 is connected to the source of positive voltage 18. The emitter of transistor 20 is connected through a resistor 22 to the collector of a transistor 24. Transistor 24 has its emitter connected to the negative voltage source 14 and its base and collector connected in common with resistor 22. The current flowing through resistor 22 is labeled by the arrow as current $I_1$ and is referred to as the first current in describing this invention.

A transistor device 26 has its base connected to the junction between resistor 22 and transistor 24. The collector of transistor device 26 is labeled as carrying current $I_2$ by the arrow and is referred to as the second current in describing this invention. Current $I_2$ has a positive temperature coefficient with respect to current $I_1$. Transistor device 26 has its emitter connected through resistor 28 to the negative voltage source 14. In particular, transistor device 26 would consist of a plurality of individual transistors formed as a common device or on a common integrated circuit device in a parallel configuration and having identical geometry to that of transistor 20. Thus, transistor device 26 is not necessarily a single transistor but may be a group of transistors such as 10 transistors formed in a parallel configuration. Within the scope of the invention, however, it is possible that a single transistor could function as transistor device 26. The preferred configuration of a group of parallel transistors provides for a comparatively large voltage drop across resistor 28 to allow current $I_2$ to be smaller than current $I_1$. Further, the circuit is less sensitive to base sheet restivity variations in a monolithic large scale integrated circuit where device 26 consists of a plurality of parallel transistors.

The collector of device 26 is connected to the collector of transistor 30 and the base of transistor 32. Transistor 30 has its emitter connected to a ground potential indicated by the symbol at 34 and its base connected to the emitter of transistor 32.

A transistor 36 has its base and collector connected in common with the base of transistor 30 and the emitter of transistor 32. The emitter of transistor 36 is connected to ground potential. Transistors 30, 32 and 36 constitute a current source. Transistor 32 provides a return path for base current as a component of current $I_2$ which has been withdrawn as a loss by the base of transistor 30 thus making this current source gain independent with respect to the gains of the three transistors 30, 32 and 36. The collector current of transistor 32 is defined as current $I_3$ and is equal to current $I_2$. Current $I_3$ establishes a voltage $V_2$ at junction 40.

A resistor 42 is connected from junction 40 to the collector of a transistor 44 which in turn has its emitter connected to the negative voltage potential at 14. Resistor 46 is connected from the base to the collector of transistor 44 and resistor 48 is connected from the base to the emitter of transistor 44. The junction of resistor 42 with the collector of transistor 44 is defined as junction 50 as potential $V_3$. Current $I_3$ establishes voltage $V_2$. This voltage is stable with respect to variations in the source power supply, transistor gain and resistance variations. $V_2$ is stable with respect to resistivity because resistor 42 and resistor 22 change in the same way and quantity as temperature varies. Thus, $V_2$ increases with temperature because $I_2$ and therefore $I_3$ increase with temperature.

Transistor 52 has its base connected with junction 40 and its collector connected with ground potential at 54. The emitter of transistor 52 is connected through a resistor 56 to the negative voltage potential at 14. Transistor 58 has its base connected to the junction between the emitter of transistor 52 and resistor 56. The emitter of transistor 58 is connected through resistor 60 to the negative voltage source at 14. The collector of transistor 58 is connected to junction point 62 which represents the connection point to which a load would be connected. The current flowing in the collector of transistor 58 is defined as $I_4$ representing output current of the circuit.

Transistors 52 and 58 impress voltage $V_2$ minus a constant voltage caused by the base emitter voltages of transistors 52 and 58 across resistor 60. Thus, transistors 52 and 58 serve as an emitter follower circuit and a third voltage is generated slightly offset from $V_2$ but which varies with temperature in the same way. Temperature compensation is achieved because the current $I_4$ in the collector of transistor 58 will vary as the voltage across resistor 60 is varied in a temperature-related way because of the temperature variation characteristics of $V_2$. However, a load is temperature compensated because the internal resistance of the load also changes with temperature but in the opposite way from the source. Thus, a differential amplifier can have constant gain even with ambient temperature variations because of the way in which the current source is made to vary with temperature.

Figure 2:
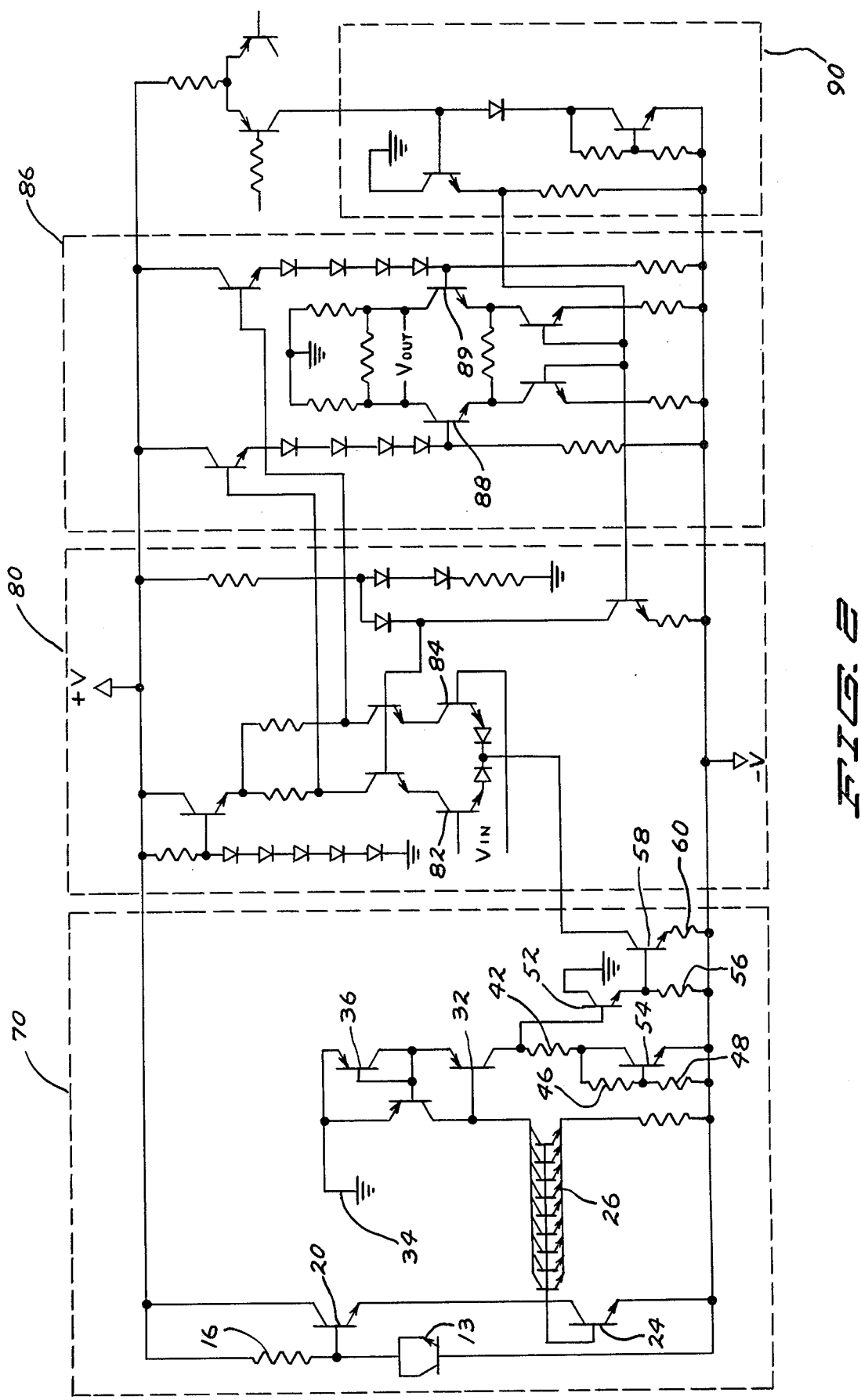
FIG. 2 is a circuit diagram of a temperature compensated current source in combination with a two-stage differential amplifier to provide a temperature compensated amplifier according to the present invention.

Referring now to FIG. 2, a temperature compensated current source according to the present invention and similar to that shown in FIG. 1 is shown in dotted line box 70 connected with a two-stage differential amplifier. A bipolar transistor 13 with its collector and emitter in parallel is a zener diode. In a monolithic integrated circuit a zener diode is constructed by connecting the collector and emitter of a transistor together. The same reference numerals are used in FIG. 2 as in FIG. 1 to describe like parts of the invention.

The ratio of resistor 42 to resistor 60 establishes the slope of the temperature characteristic to any desired temperature coefficient so that the temperature coefficient of the combination current source and amplifier can be very close to zero.

The new current source according to the present invention with a positive rather than a negative temperature coefficient is readily adapted to the differential amplifier stages as shown in FIG. 2.

The current source 70 according to the present invention is used to provide a temperature compensated current for the initial stage of amplification 80 while a conventional current source 90 can provide regulated current for the second differential amplifier stage 86.

Differential amplifier 80 is a single-stage differential amplifier with transistors 82 and 84 serving as the input stage. Differential amplifier 86 is a single-stage differential amplifier with transistors 88 and 89 serving as the output stage of the circuit.

Because temperature compensated current source 70 compensates directly for temperature variations in gain of the critical first stage amplifier 80 of a multiple-stage amplifier, the degree of compensation in the current source can also be adjusted to allow for proportionately smaller indirect factors of temperature related gain variations such as current source 90 and amplifier stage 86. Thus adjustment of the ratio resistances of resistors 42 and 60 may temperature compensate the entire circuit and not just amplifier stage 80.

What is claimed is:

1. A temperature compensated current source comprising:
   a first semiconductor device for producing a first reference voltage,
   means for establishing a first reference current dependent on said reference voltage and connected with said first semiconductor device,
   a second semiconductor device adapted to be connected with said means for establishing a first reference current, said second semiconductor device establishing a second reference current in response to said first reference current,
   a current source means connected to said second semiconductor device for generating a third reference current essentially identical to said second reference current,
   means connected with said current source means for establishing a second reference voltage using the voltage created by passing said third reference current through a resistance,
   means connected with said means for establishing a second reference voltage for generating a third voltage related to said second reference voltage by varying the same way with respect to temperature and without affecting the source of said third reference current, and
   means for impressing said third voltage across a resistance and thus creating a current which represents the output current of said circuit.

2. The apparatus of claim 1 wherein said second semiconductor device establishes said second reference current so that it has a positive temperature coefficient.

3. The apparatus of claim 1 wherein said current source means is comprised of three transistors such that the collector of one of said transistors is the source of said third current and provides electrical isolation of said third current from the characteristics of said transistors.

4. The apparatus of any one of claims 1, 2 or 3 in which the output current of said circuit has a positive temperature coefficient.

5. A temperature compensated differential amplifier circuit comprising:
   a first differential amplifier having at least a pair of transistors in a differential amplifier configuration requiring a common source of current for the emitters of at least the first pair of transistors and having as its input the input to said circuit, a second differential amplifier connected to the output of said first differential amplifier and having as its output the output of said circuit and having at least a pair of transistors in a differential amplifier configuration requiring a common source of current for the emitter of at least the first pair of transistors, a current source means for providing a regulated current for the common source of current for the emitters of at least the first pair of transistors of said second differential amplifier, and a current source means for said first differential amplifier providing the common source of current for the emitters of said first pair of transistors thereof and having a temperature coefficient opposite that of said first differential amplifier, said current source comprising:

a first semiconductor device for producing a first reference voltage, means for establishing a first reference current dependent on said reference voltage and connected with said first semiconductor device, a second semiconductor device adapted to be connected with said means for establishing a first reference current, said second semiconductor device establishing a second reference current in response to said first reference current, a current source means connected to said second semiconductor device for generating a third reference current essentially indentical to said second reference current, means connected with said current source means for establishing a second reference voltage using the voltage created by passing said third reference current through a resistance, means connected with said means for establishing a second reference voltage for generating a third voltage related to said second reference voltage by varying the same way with respect to temperature and without affecting the source of said third reference current, and means for impressing said third voltage across a resistance and thus creating a current which represents the output current of said circuit.

6. The apparatus of claim 5 wherein said second semiconductor device establishes said second reference current so that it has a positive temperature coefficient.

7. The apparatus of claim 5 wherein said current source means is comprised of three transistors such that the collector of one of said transistors is the source of said third current and provides electrical isolation of said third current from the characteristics of said transistors.

8. The apparatus of any one of claims 5, 6 or 7 in which the output current of said circuit has a positive temperature coefficient.

9. A temperature compensated current source comprising:

a reference voltage source, first transistor means connected to said reference voltage source to generate a first reference current in its emitter circuit, second transistor means operatively connected in the emitter circuit of said first transistor means to detect the emitter current flowing in said circuit, said second transistor means generating a second current in its collector circuit which is a current proportional to said first current and wherein the proportion is a ratio determined by the resistance of a resistor in the emitter circuit of said second transistor means and the resistance of a resistor in the emitter circuit of said first transistor means, third, fourth and fifth transistors operatively connected in the collector circuit of said second transistor to generate a third current in the collector of said fifth transistor which is equal to said second current and which is isolated from said second current by said third, fourth and fifth transistors and wherein said third current is independent of the individual gains of said third, fourth and fifth transistors, resistance means for generating a voltage which is determined by said third current, sixth and seventh transistor means comprising an emitter follower circuit for generating a voltage at the emitter of said seventh transistor means which is referenced to the voltage generated by said third current and varies in the same way with respect to temperature, resistance means in the emitter circuit of said seventh transistor means for generating a current in response to the voltage generated thereacross by said emitter follower circuit means and wherein said current is the output current of said circuit, and wherein said resistance through which said third current generates a voltage and said resistance connected in the emitter circuit of said emitter follower circuit have resistances the ratio of which determines the slope of the temperature dependent response characteristics of said current source in response to fluctuations in response to temperature.

10. The apparatus of claim 9 wherein said second current has a positive temperature coefficient.

11. The apparatus of claim 9 wherein said second transistor means is a plurality of transistors connected in parallel.

* * * * *